United States Patent
Lv et al.

(10) Patent No.: US 10,505,024 B2
(45) Date of Patent: Dec. 10, 2019

(54) METHOD FOR PREPARING CAP-LAYER-STRUCTURED GALLIUM OXIDE FIELD EFFECT TRANSISTOR

(71) Applicant: The 13th Research Institute Of China Electronics Technology Group Corporation, Shijiazhuang (CN)

(72) Inventors: Yuanjie Lv, Shijiazhuang (CN); Xubo Song, Shijiazhuang (CN); Zhihong Feng, Shijiazhuang (CN); Yuangang Wang, Shijiazhuang (CN); Xin Tan, Shijiazhuang (CN); xingye Zhou, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 25 days.

(21) Appl. No.: 15/796,625

(22) Filed: Oct. 27, 2017

(65) Prior Publication Data

US 2019/0027590 A1 Jan. 24, 2019

(30) Foreign Application Priority Data

Jul. 20, 2017 (CN) .......................... 2017 1 0596614

(51) Int. Cl.
*H01L 21/30* (2006.01)
*H01L 21/02* (2006.01)
(Continued)

(52) U.S. Cl.
CPC ...... *H01L 29/66969* (2013.01); *H01L 21/265* (2013.01); *H01L 21/308* (2013.01); *H01L 21/3065* (2013.01); *H01L 21/30604* (2013.01); *H01L 29/24* (2013.01); *H01L 29/78* (2013.01); *H01L 21/02483* (2013.01); *H01L 21/02502* (2013.01); *H01L 21/02565* (2013.01); *H01L 21/02581* (2013.01)

(58) Field of Classification Search
CPC ...................................................... H01L 21/308
See application file for complete search history.

(56) References Cited

U.S. PATENT DOCUMENTS

| 2017/0278933 A1* | 9/2017 | Sasaki | H01L 29/24 |
| 2017/0278961 A1* | 9/2017 | Hill | H01L 29/32 |
| 2018/0090577 A1* | 3/2018 | Makiyama | H03F 3/1935 |

* cited by examiner

*Primary Examiner* — Moazzam Hossain
*Assistant Examiner* — Omar F Mojaddedi
(74) *Attorney, Agent, or Firm* — Dinsmore & Shohl LLP

(57) ABSTRACT

A method for preparing a cap-layer-structured gallium oxide field effect transistor, includes: removing a gallium oxide channel layer and a gallium oxide cap layer from a passive area of a gallium oxide epitaxial wafer; respectively removing the gallium oxide cap layer corresponding to a source region of the gallium oxide epitaxial wafer and the gallium oxide cap layer corresponding to a drain region of the gallium oxide epitaxial wafer; respectively doping a portion of the gallium oxide channel layer corresponding to the source region and a portion of the gallium oxide channel layer corresponding to the drain region with an N-type impurity; respectively capping an upper surface of the gallium oxide channel layer corresponding to the source region and an upper surface of the gallium oxide channel layer corresponding to the drain region with a first metal layer to respectively form a source and a drain; and forming a gate.

9 Claims, 2 Drawing Sheets

(51) Int. Cl.
*H01L 29/66* (2006.01)
*H01L 21/3065* (2006.01)
*H01L 21/265* (2006.01)
*H01L 21/308* (2006.01)
*H01L 21/306* (2006.01)
*H01L 29/78* (2006.01)
*H01L 29/24* (2006.01)

METHOD FOR PREPARING CAP-LAYER-STRUCTURED GALLIUM OXIDE FIELD EFFECT TRANSISTOR

CROSS-REFERENCE TO RELATED APPLICATIONS

This application claims priority of China Patent Application No. 201710596614.4 filed Jul. 20, 2017.

FIELD OF THE INVENTION

The present application relates to the technical field of semiconductor, and more particularly relates to a method for preparing a cap-layer-structured gallium oxide field effect transistor.

BACKGROUND OF THE INVENTION

Gallium oxide ($Ga_2O_3$) is an oxide of metal gallium, a $Ga_2O_3$ metal-oxide-semiconductor field effect transistor (MOSFET) is advantageous in its stable chemical property, high pressure resistance, low loss, low power leakage, high temperature resistance, radiation resistance, high reliability, and low production cost, and is widely applied in devices, such as, power supply systems, electric vehicles, hybrid vehicles, large-scale devices in plants, photovoltaic power generation systems, air conditioners, servers, personal computers, etc. In order to decrease the power leakage of the gate during preparation process of the $Ga_2O_3$ MOSFET, atomic layer deposition (ALD) is generally adopted to grow $Al_2O_3$, $HfO_2$, $SiO_2$, and compounds thereof, or plasma enhanced chemical vapor deposition (PECVD) is generally adopted to grow SiN and compounds thereof, on the upper surface of the gate region as a dielectric layer, however, because lattice mismatch and interface defects exist between the dielectric layers and $Ga_2O_3$, the performance of the MOSFET is lowered.

SUMMARY OF THE INVENTION

In view of the above-described problems, one embodiment of the present application provide a method for preparing a cap-layer-structured gallium oxide field effect transistor, aiming at solving the problem, among others, in the prior art that lattice mismatch and interface defects exist between the dielectric layer and $Ga_2O_3$, resulting in lowered performance of the MOSFET.

In order to solve the above-described technical problem, the technical solution adopted by the present application is as follows:

A method for preparing a cap-layer-structured gallium oxide field effect transistor, comprises the following steps:

removing a gallium oxide channel layer and a gallium oxide cap layer from a passive area of a gallium oxide epitaxial wafer, in which, the gallium oxide epitaxial wafer comprises, from bottom to top, a substrate layer, a gallium oxide buffer layer, the gallium oxide channel layer, and the gallium oxide cap layer, and the gallium oxide cap layer is an insulating layer;

respectively removing the gallium oxide cap layer corresponding to a source region of the gallium oxide epitaxial wafer and the gallium oxide cap layer corresponding to a drain region of the gallium oxide epitaxial wafer;

respectively doping a portion of the gallium oxide channel layer corresponding to the source region and a portion of the gallium oxide channel layer corresponding to the drain region with an N-type impurity;

respectively capping an upper surface of the gallium oxide channel layer corresponding to the source region and an upper surface of the gallium oxide channel layer corresponding to the drain region with a first metal layer to respectively form a source and a drain; and capping an upper surface of the gallium oxide cap layer corresponding to a gate region with a second metal layer to form a gate, in which, the source region and the drain region are respectively located at two sides of the gate region.

Optionally, the method further comprises:

capping a passivation protection layer on an upper surface of the gallium oxide field effect transistor, and removing the passivation protection layer from an energized position of the gate, the passivation protection layer from an energized position of the source, and the passivation protection layer from an energized position of the drain.

Optionally, before the step of removing the gallium oxide channel layer and the gallium oxide cap layer from the passive area of the gallium oxide epitaxial wafer, the method further comprises:

preparing the gallium oxide epitaxial wafer; and the step of preparing the gallium oxide epitaxial wafer particularly comprises sequentially growing the gallium oxide buffer layer, the gallium oxide channel layer, and the gallium oxide cap layer on the substrate.

Optionally, the step of removing the gallium oxide channel layer and the gallium oxide cap layer from the passive area of the gallium oxide epitaxial wafer particularly comprises:

applying a photoresist to an upper surface of the active area of the gallium oxide epitaxial wafer by photolithography;

etching the gallium oxide channel layer and the gallium oxide cap layer of the passive area by an etching process until the gallium oxide buffer layer is exposed; and removing the photoresist.

Optionally, the step of respectively removing the gallium oxide cap layer corresponding to the source region of the gallium oxide epitaxial wafer and the gallium oxide cap layer corresponding to the drain region of the gallium oxide epitaxial wafer particularly comprises:

applying a photoresist to upper surfaces of regions of the gallium oxide epitaxial wafer other than the source region and the drain region by photolithography;

etching the gallium oxide cap layer corresponding to the source region and the gallium oxide cap layer corresponding to the drain region by an etching process until the gallium oxide channel layer is exposed; and removing the photoresist.

Optionally, the step of respectively doping the portion of the gallium oxide channel layer corresponding to the source region and the portion of the gallium oxide channel layer corresponding to the drain region with the N-type impurity particularly comprises:

respectively doping the portion of the gallium oxide channel layer corresponding to the source region and the portion of the gallium oxide channel layer corresponding to the drain region with the N-type impurity having a concentration of greater than $7 \times 10^7$ $cm^{-3}$ by ion implantation.

Optionally, the step of respectively capping the upper surface of the gallium oxide channel layer corresponding to the source region and the upper surface of the gallium oxide channel layer corresponding to the drain region with the first metal layer to respectively form the source and the drain particularly comprises:

applying a photoresist to regions other than the source region and the drain region by photolithography;

capping the gallium oxide channel layer corresponding to the source region and the gallium oxide channel layer corresponding to the drain region with the first metal layer by an electron beam evaporation process;

respectively allowing the gallium oxide channel layer corresponding to the source region and the gallium oxide channel layer corresponding to the drain region to form Ohmic contact with the first metal layer by an annealing process; and removing the photoresist.

Optionally, the step of capping the upper surface of the gallium oxide cap layer corresponding to the gate region with the second metal layer to form the gate particularly comprises:

applying a photoresist to regions other than the gate region by photolithography;

capping an upper surface of the gallium oxide cap layer corresponding to the gate region with the second metal layer via an electron beam evaporation process; and removing the photoresist.

Optionally, the gallium oxide cap layer is doped with element magnesium or element iron.

Optionally, the first metal layer is a titanium/gold alloy or a titanium/aluminum/nickel/gold alloy; and the second metal layer a nickel/gold alloy or a platinum/gold alloy.

Advantageous effects produced by the above-described technical solution are as follows: in the embodiments of the present application, when preparing the $Ga_2O_3$ MOSFET, devices are prepared on the epitaxial wafer having an insulating gallium oxide cap layer, the gallium oxide cap layer is used as a dielectric layer of the gate region, no additional dielectric layer is required to be grown, so that the lowered performance of the MOSFET caused by the lattice mismatch and interface defects existing between the dielectric layer and $Ga_2O_3$ is avoided, thereby improving the performance of the MOSFET.

DETAILED DESCRIPTION OF THE PREFERRED EMBODIMENTS

In order to make the purposes, technical solutions, and advantages of the present application be clearer and more understandable, the present application will be further described in detail hereinafter with reference to the accompanying drawings and embodiments. It should be understood that the embodiments described herein are only intended to illustrate but not to limit the present application.

In one embodiment of the present application, a gallium oxide epitaxial wafer is divided into an active area and a passive area, the active area refers to a mesa region, that is, a region for preparing an active device, a portion other than the active area is the passive area. The active area is further divided into a source region, a gate region, and a drain region; and the source region and the drain region are respectively located on two sides of the gate region.

Figure 1:
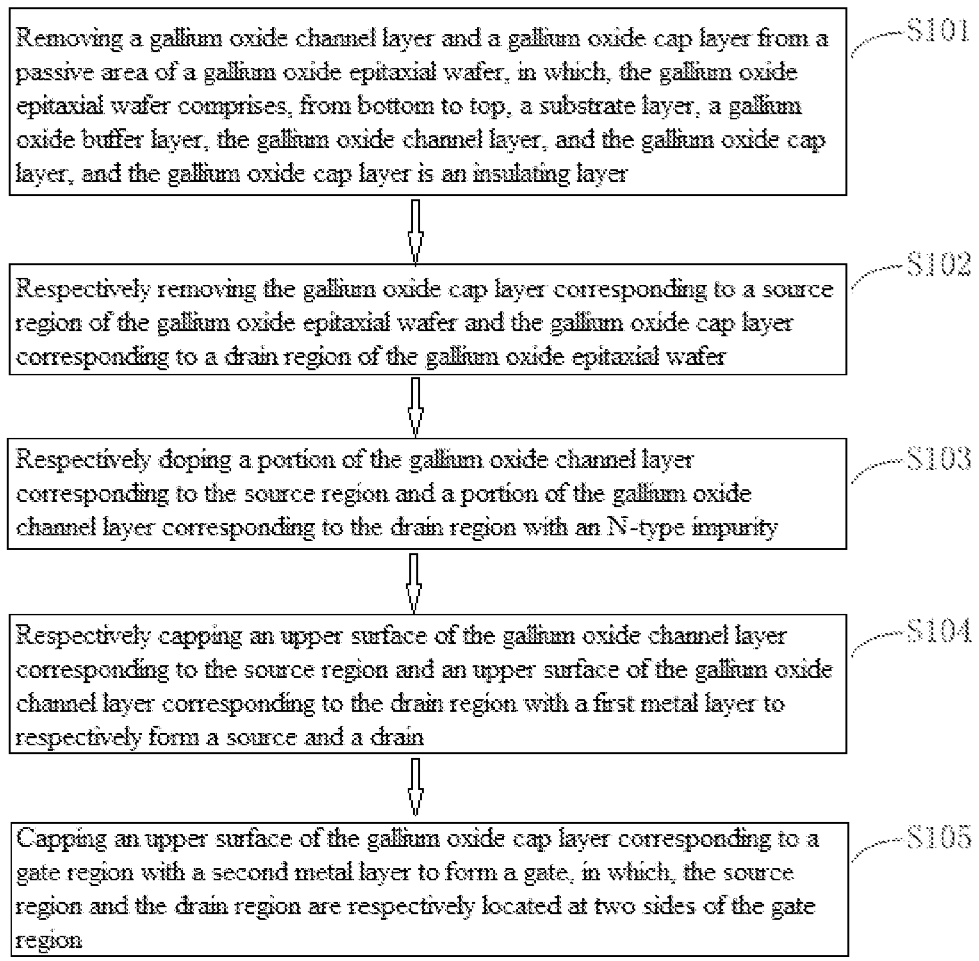
FIG. 1 is a schematic flow chart of a method for preparing a $Ga_2O_3$ MOSFET provided by one embodiment of the present application.
Figure 2:
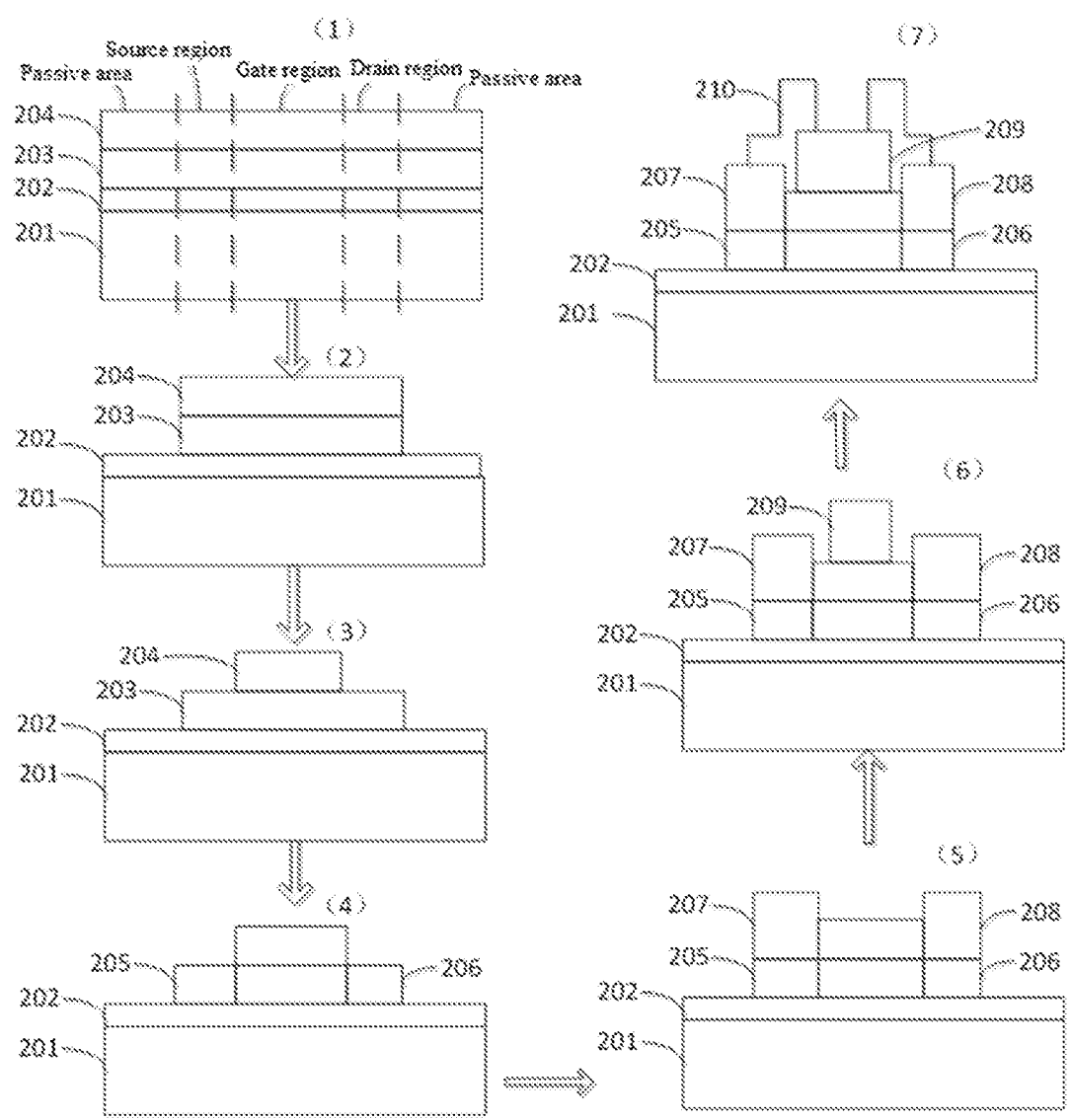
FIG. 2 is a cut-away structural schematic view of a method for preparing a $Ga_2O_3$ MOSFET provided by one embodiment of the present application.

Please refer to FIGS. 1-2, FIG. 1 is a schematic flow chart of a method for preparing a $Ga_2O_3$ MOSFET provided by one embodiment of the present application, and FIG. 2 is a cut-away structural schematic view of the method for preparing the $Ga_2O_3$ MOSFET provided by one embodiment of the present application. The method comprises the following steps:

S101, removing a gallium oxide channel layer and a gallium oxide cap layer from a passive area of a gallium oxide epitaxial wafer; in which, the gallium oxide epitaxial wafer comprises, from bottom to top, a substrate layer, a gallium oxide buffer layer, the gallium oxide channel layer, and the gallium oxide cap layer; and the gallium oxide cap layer is an insulating layer.

Optionally, before S101, the method further comprises preparing the gallium oxide epitaxial wafer; and the step of preparing the gallium oxide epitaxial wafer particularly comprises sequentially growing the gallium oxide buffer layer 202, the gallium oxide channel layer 203, and the gallium oxide cap layer 204 on the substrate.

Optionally, the gallium oxide cap layer 204 is doped with element magnesium or element iron.

In one embodiment of the present application, as shown in FIG. 2(1), the gallium oxide epitaxial wafer comprises, from bottom to top, the substrate layer 201, the gallium oxide buffer layer 202, the gallium oxide channel layer 203, and the gallium oxide cap layer 204. The substrate layer 201 comprises, but is not limited to, a $Ga_2O_3$ substrate, a sapphire substrate, a silicon substrate, a SiC substrate, a MgO substrate, a GaAs substrate, and a InP substrate. The gallium oxide buffer layer 202 is grown by metal-organic chemical vapor deposition (MOCVD), hydride vapor epitaxy (HVPE), or molecular beam epitaxy (MBE); no element is doped during the growing process of the gallium oxide buffer layer 202 in order to obtain a buffer layer with high insulation property. A thickness of the gallium oxide buffer layer 202 is not greater than 0.1 μm. The gallium oxide channel layer 203 is grown by the MOCVD, HVPE, or MBE, and doped with element silicon or element tin with a doping concentration of no greater than $1\times10^{20}$ cm$^{-3}$, and a thickness of the gallium oxide channel layer 203 is smaller than 0.4 μm. The gallium oxide cap layer 204 is grown by the MOCVD, HVPE, or MBE, the gallium oxide cap layer 204 is an insulating layer, and the gallium oxide cap layer 204 is doped with the element magnesium or the element iron to improve the insulation property thereof.

Optionally, in S101, the operation of removing the gallium oxide channel layer and the gallium oxide cap layer from the passive area of the gallium oxide epitaxial wafer is realized as follows: applying a photoresist to an upper surface of the active area of the gallium oxide epitaxial wafer by photolithography; etching the gallium oxide channel layer and the gallium oxide cap layer of the passive area by an etching process until the gallium oxide buffer layer is exposed; and removing the photoresist.

In one embodiment of the present application, as shown in FIG. 2(2), the active area, that is, the mesa region, is protected by the photoresist by adopting the photolithography to prevent the active area from being etched during the etching process, the passive area, that is, the non-mesa region, is exposed, and the gallium oxide channel layer and the gallium oxide cap layer of the passive area are then etched by dry etching or wet etching to ensure that an etch stop surface enters the buffer layer and that good insulation effect between the active area and the passive area is realized.

S102, respectively removing the gallium oxide cap layer corresponding to the source region of the gallium oxide epitaxial wafer and the gallium oxide cap layer corresponding to the drain region of the gallium oxide epitaxial wafer.

Optionally, S102 is particularly realized as follows: applying a photoresist to upper surfaces of regions of the gallium oxide epitaxial wafer other than the source region and the drain region by photolithography; etching the gallium oxide cap layer corresponding to the source region and the gallium oxide cap layer corresponding to the drain region by an etching process until the gallium oxide channel layer is exposed; and removing the photoresist.

In one embodiment of the present application, as shown in FIG. 2(3), photolithography is firstly adopted to protect the regions other than the source region and the drain region to protect the photoresist and expose the source region and the drain region. Thereafter, the dry etching or wet etching is adopted to etch the gallium oxide cap layers of the source region and the drain region, the etching process is stopped until the etching reaches the gallium oxide channel layers, the gallium oxide cap layers of the source region and the drain region are completely etched, thereby ensuring that the gallium oxide channel layers of the source region and the drain region are exposed.

S103, respectively doping a portion of the gallium oxide channel layer corresponding to the source region and a portion of the gallium oxide channel layer corresponding to the drain region with an N-type impurity.

Optionally, S103 is particularly realized as follows: respectively doping the portion of the gallium oxide channel layer corresponding to the source region and the portion of the gallium oxide channel layer corresponding to the drain region with the N-type impurity having a concentration of greater than $7 \times 10^7$ cm$^{-3}$ by ion implantation.

In one embodiment of the present application, as shown in FIG. 2(4), by ion implantation, the element silicon or the element tin is implanted on the source region and the drain region respectively via a source implantation region 205 and a drain implantation region 206, the doping concentration is greater than $7 \times 10^7$ cm$^{-3}$, which is beneficial to good Ohmic contact.

S104, respectively capping an upper surface of the gallium oxide channel layer corresponding to the source region and an upper surface of the gallium oxide channel layer corresponding to the drain region with a first metal layer to respectively form a source and a drain.

Optionally, S104 is particularly realized as follows: applying a photoresist to regions other than the source region and the drain region by photolithography; capping the gallium oxide channel layer corresponding to the source region and the gallium oxide channel layer corresponding to the drain region with the first metal layer by an electron beam evaporation process; respectively allowing the gallium oxide channel layer corresponding to the source region and the gallium oxide channel layer corresponding to the drain region to form Ohmic contact with the first metal layer by an annealing process; and removing the photoresist.

In one embodiment of the present application, as shown in FIG. 2(5), the photolithography is adopted to protect the regions other than the source region and the drain region by the photoresist to avoid deposition of the metal layer on such regions, the electron beam evaporation process is adopted to cap the upper surface of the gallium oxide channel layer corresponding to the source region with the first metal layer 207 and to cap the upper surface of the gallium oxide channel layer corresponding to the drain region with the first metal layer 208. In the $N_2$ or vacuum environment, fast annealing process is adopted to realize good Ohmic contact, an annealing temperature is higher than 300° C. and lower than 1500° C., and an annealing time is less than 5 min.

S105, capping an upper surface of the gallium oxide cap layer corresponding to the gate region with a second metal layer to form a gate; wherein the source region and the drain region are respectively located at two sides of the gate region.

Optionally, in S105, operation of capping the upper surface of the gallium oxide cap layer corresponding to the gate region with the second metal layer to form the gate is particularly realized as follows: applying a photoresist to regions other than the gate region by photolithography; capping an upper surface of the gallium oxide cap layer corresponding to the gate region with the second metal layer via an electron beam evaporation process; and removing the photoresist.

In one embodiment of the present application, as shown in FIG. 2(6), the upper surface of the gallium oxide cap layer of the gate region is capped with the second metal layer 209 by the electron beam evaporation process to form the gate, and a length of the gate is between 0.1 μm and 100 μm.

Optionally, the first metal layer is a titanium/gold alloy or a titanium/aluminum/nickel/gold alloy; and the second metal layer a nickel/gold alloy or a platinum/gold alloy.

When preparing the $Ga_2O_3$ MOSFET in one embodiment of the present application, devices are prepared on the epitaxial wafer having an insulating gallium oxide cap layer, the gallium oxide cap layer is used as a dielectric layer of the gate region, no additional dielectric layer is required to be grown, so that the lowered performance of the MOSFET resulted from the lattice mismatch and interface defects existing between the dielectric layer and $Ga_2O_3$ is avoided, thereby improving the performance of the MOSFET.

Optionally, the method further comprises: capping a passivation protection layer on an upper surface of the gallium oxide field effect transistor, and removing the passivation protection layer from energized positions of the gate, the source, and the drain.

In one embodiment of the present application, as shown in FIG. 2(7), SiN passivation protection layer 210 is grown by using plasma enhanced chemical vapor deposition (PECVD), and the passivation protection layer at energized positions of the gate, the source, and the drain is etched by the photolithography and the etching process. The device is performed with the passivation protection treatment, and the passivation layer at the energized positions of the device is etched, thereby being convenient to the test of the device.

The aforementioned embodiments are only preferred embodiments of the present application, and are not intended to limit the present application. Any modification, equivalent replacement, improvement, and so on, which are made within the spirit and the principle of the present application, should be included in the protection scope of the present application.

The invention claimed is:

1. A method for preparing a cap-layer-structured gallium oxide field effect transistor, comprising the following steps:
   sequentially growing a gallium oxide buffer layer, a gallium oxide channel layer, and a gallium oxide cap layer on a substrate layer to form a gallium oxide epitaxial wafer, wherein the gallium oxide epitaxial wafer comprises the substrate layer, the gallium oxide buffer layer, the gallium oxide channel layer, and the gallium oxide cap layer arranged consecutively in sequence from bottom to top; wherein the gallium oxide cap layer is an insulating layer;

removing the gallium oxide channel layer and the gallium oxide cap layer from a passive area of the gallium oxide epitaxial wafer;

respectively removing the gallium oxide cap layer corresponding to a source region of the gallium oxide epitaxial wafer, and the gallium oxide cap layer corresponding to a drain region of the gallium oxide epitaxial wafer;

respectively doping a portion of the gallium oxide channel layer corresponding to the source region and a portion of the gallium oxide channel layer corresponding to the drain region with an N-type impurity;

respectively capping an upper surface of the gallium oxide channel layer corresponding to the source region and an upper surface of the gallium oxide channel layer corresponding to the drain region with a first metal layer, to respectively form a source and a drain; and capping an upper surface of the gallium oxide cap layer corresponding to a gate region with a second metal layer to form a gate; wherein the source region and the drain region are respectively located at two sides of the gate region.

2. The method of claim 1, further comprising:

capping a passivation protection layer on an upper surface of the gallium oxide field effect transistor, and removing the passivation protection layer from an energized position of the gate, the passivation protection layer from an energized position of the source, and the passivation protection layer from an energized position of the drain.

3. The method of claim 1, wherein the step of removing the gallium oxide channel layer and the gallium oxide cap layer from the passive area of the gallium oxide epitaxial wafer particularly comprises:

applying a photoresist to an upper surface of the active area of the gallium oxide epitaxial wafer by photolithography;

etching the gallium oxide channel layer and the gallium oxide cap layer of the passive area by an etching process until the gallium oxide buffer layer is exposed; and removing the photoresist.

4. The method of claim 1, wherein the step of respectively removing the gallium oxide cap layer corresponding to the source region of the gallium oxide epitaxial wafer and the gallium oxide cap layer corresponding to the drain region of the gallium oxide epitaxial wafer particularly comprises:

applying a photoresist to upper surfaces of regions of the gallium oxide epitaxial wafer other than the source region and the drain region by photolithography;

etching the gallium oxide cap layer corresponding to the source region and the gallium oxide cap layer corresponding to the drain region by an etching process until the gallium oxide channel layer is exposed; and removing the photoresist.

5. The method of claim 1, wherein the step of respectively doping the portion of the gallium oxide channel layer corresponding to the source region and the portion of the gallium oxide channel layer corresponding to the drain region with the N-type impurity particularly comprises:

respectively doping the portion of the gallium oxide channel layer corresponding to the source region and the portion of the gallium oxide channel layer corresponding to the drain region with the N-type impurity having a concentration of greater than $7 \times 10^7$ cm$^{-3}$ by ion implantation.

6. The method of claim 1, wherein the step of respectively capping the upper surface of the gallium oxide channel layer corresponding to the source region and the upper surface of the gallium oxide channel layer corresponding to the drain region with the first metal layer to respectively form the source and the drain particularly comprises:

applying a photoresist to regions other than the source region and the drain region by photolithography;

capping the gallium oxide channel layer corresponding to the source region and the gallium oxide channel layer corresponding to the drain region with the first metal layer by an electron beam evaporation process;

respectively allowing the gallium oxide channel layer corresponding to the source region and the gallium oxide channel layer corresponding to the drain region to form Ohmic contact with the first metal layer by an annealing process; and removing the photoresist.

7. The method of claim 1, wherein the step of capping the upper surface of the gallium oxide cap layer corresponding to the gate region with the second metal layer to form the gate particularly comprises:

applying a photoresist to regions other than the gate region by photolithography;

capping an upper surface of the gallium oxide cap layer corresponding to the gate region with the second metal layer via an electron beam evaporation process; and removing the photoresist.

8. The method of claim 1, wherein the gallium oxide cap layer is doped with element magnesium or element iron.

9. The method of claim 1, wherein the first metal layer is a titanium/gold alloy or a titanium/aluminum/nickel/gold alloy; and the second metal layer is a nickel/gold alloy or a platinum/gold alloy.

* * * * *